(12) United States Patent
Tanaka et al.

(10) Patent No.: US 12,727,272 B2
(45) Date of Patent: Sep. 1, 2026

(54) IMAGE SENSOR AND IMAGING DEVICE

(71) Applicant: SONY SEMICONDUCTOR SOLUTIONS CORPORATION, Kanagawa (JP)

(72) Inventors: Hiroshi Tanaka, Kumamoto (JP); Yusuke Moriya, Kumamoto (JP); Takushi Shigetoshi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 398 days.

(21) Appl. No.: 17/755,989

(22) PCT Filed: Sep. 15, 2020

(86) PCT No.: PCT/JP2020/034929

§ 371 (c)(1),
(2) Date: May 13, 2022

(87) PCT Pub. No.: WO2021/100298

PCT Pub. Date: May 27, 2021

(65) Prior Publication Data

US 2022/0406832 A1 Dec. 22, 2022

(30) Foreign Application Priority Data

Nov. 21, 2019 (JP) ................................ 2019-210864

(51) Int. Cl.
*H10F 39/00* (2025.01)

(52) U.S. Cl.
CPC ....... *H10F 39/8063* (2025.01); *H10F 39/024* (2025.01); *H10F 39/8053* (2025.01); *H10F 39/8067* (2025.01)

(58) Field of Classification Search
CPC ......... H01L 27/14623; H01L 27/14627; H01L 27/14621; H01L 27/1464; H01L 27/14643
See application file for complete search history.

(56) References Cited

U.S. PATENT DOCUMENTS

| | | | |
|---|---|---|---|
| 6,117,735 | A | 9/2000 | Ueno |
| 2009/0014823 | A1 | 1/2009 | Kokusenya |

(Continued)

FOREIGN PATENT DOCUMENTS

| | | | |
|---|---|---|---|
| CN | 101853871 | A | 10/2010 |
| CN | 103681710 | A | 3/2014 |

(Continued)

OTHER PUBLICATIONS

Japanese Patent No. 2005-294647 [machine's translation].*

(Continued)

*Primary Examiner* — Tony Tran
(74) *Attorney, Agent, or Firm* — CHIP LAW GROUP

(57) ABSTRACT

The sensitivity of an image sensor is improved.
The image sensor includes a plurality of pixels and a light-blocking wall. The plurality of pixels included in the image sensor each includes a photoelectric conversion unit disposed on a semiconductor substrate and photoelectrically converting incident light that is irradiated, and an on-chip lens that focuses the incident light onto the photoelectric conversion unit. The light-blocking wall included in the image sensor is disposed adjacent to the semiconductor substrate at a boundary between the plurality of pixels and configured such that a side of the light-blocking wall that is irradiated with the incident light has a tapered-shape cross-section, the light-blocking wall blocking the incident light.

7 Claims, 10 Drawing Sheets

(56) References Cited

U.S. PATENT DOCUMENTS

| | | | |
|---|---|---|---|
| 2015/0076643 | A1 | 3/2015 | Kikuchi |
| 2015/0084144 | A1 | 3/2015 | Suzuki et al. |
| 2019/0157324 | A1 | 5/2019 | Watanabe |

FOREIGN PATENT DOCUMENTS

| | | | |
|---|---|---|---|
| CN | 103797579 | A | 5/2014 |
| CN | 104465681 | A | 3/2015 |
| CN | 106068563 | A | 11/2016 |
| DE | 19900169 | A1 | 7/1999 |
| JP | 61-154283 | A | 7/1986 |
| JP | 11-195655 | A | 7/1999 |
| JP | 2005-294647 | A | 10/2005 |
| JP | 2009-021415 | A | 1/2009 |
| JP | 2011-119445 | A | 6/2011 |
| JP | 2015-060855 | A | 3/2015 |
| JP | 2015-065270 | A | 4/2015 |
| KR | 20120120669 | A | 11/2012 |
| WO | WO-2019215986 | A1 | 11/2019 |

OTHER PUBLICATIONS

International Search Report and Written Opinion of PCT Application No. PCT/JP2020/034929, issued on Nov. 24, 2020, 11 pages of ISRWO.

* cited by examiner 306
305
303
302
301
131
110

306
305
303
302
301
131
110

303
302
301
131
110

IMAGE SENSOR AND IMAGING DEVICE

CROSS REFERENCE TO RELATED APPLICATIONS

This application is a U.S. National Phase of International Patent Application No. PCT/JP2020/034929 filed on Sep. 15, 2020, which claims priority benefit of Japanese Patent Application No. JP 2019-210864 filed in the Japan Patent Office on Nov. 21, 2019. Each of the above-referenced applications is hereby incorporated herein by reference in its entirety.

TECHNICAL FIELD

The present disclosure relates to an image sensor and an imaging device. In particular, the present disclosure relates to an image sensor in which a plurality of pixels that generate an image signal are disposed, and an imaging device using the stated image sensor.

BACKGROUND ART

An image sensor which improves optical sensitivity has been proposed thus far. For example, a solid-state image sensor constituted by photoelectric conversion units which are formed in a mosaic shape on a semiconductor substrate and that photoelectrically convert incident light, and a readout unit that reads out signals obtained from the photoelectric conversion by the photoelectric conversion units, has been proposed (e.g., PTL 1). This solid-state image sensor includes a lens array and a reflective layer. The lens array focuses the incident light on the respective photoelectric conversion units. The reflective layer functions to reflect the incident light focused on parts aside from the photoelectric conversion units by the lens array and focus that light onto the photoelectric conversion units.

In this past technique, the photoelectric conversion units are formed on the semiconductor substrate directly below the lenses that constitute the lens array, and are therefore disposed in a relatively small range. The reflective layer is configured in the shape of a light guide path from the vicinity of the edge of the lenses to the photoelectric conversion units, and is configured having a cross-section in which the diameter gradually decreases from the vicinity of the edge of the lenses to the photoelectric conversion units. The incident light focused at parts aside from the photoelectric conversion unit by the lenses is reflected by the surface of the reflective layer corresponding to an inner wall of the light guide path and guided to the photoelectric conversion units.

CITATION LIST

Patent Literature

[PTL 1]
JP S61-154283 A

SUMMARY

Technical Problem

In the above-described past technique, there is a problem in that the improvement in sensitivity is insufficient. Specifically, depending on the incident angle of the incident light focused at the parts aside from the photoelectric conversion units by the lenses, the light will be incident on the photoelectric conversion units having been reflected multiple times by the reflective layer. The reflective layer can be constituted by a metal. However, a reflective layer constituted by a metal does not reflect 100% of the incident light, but rather absorbs some of the incident light. Accordingly, when the incident light is reflected multiple times by the reflective layer, the light is absorbed by the reflective layer and is greatly attenuated. As such, in the above-described past technique, there is a problem in that the sensitivity cannot be sufficiently improved.

Having been conceived in light of the above-described problem, an object of the present disclosure is to improve the sensitivity of an image sensor.

Solution to Problem

Having been conceived in order to solve the above-described problems, a first aspect of the present disclosure is an image sensor, including: a plurality of pixels, each including a photoelectric conversion unit disposed on a semiconductor substrate and photoelectrically converting incident light that is irradiated, and an on-chip lens that focuses the incident light onto the photoelectric conversion unit; and a light-blocking wall disposed adjacent to the semiconductor substrate at a boundary between the plurality of pixels and configured such that a side of the light-blocking wall that is irradiated with the incident light has a tapered-shape cross-section, the light-blocking wall blocking the incident light.

Additionally, in this first aspect, the light-blocking wall may be configured having the tapered-shape cross-section tapered at an angle based on a height and a width of the light-blocking wall from the semiconductor substrate and a width of a light-receiving surface, the light-receiving surface being a surface of the semiconductor substrate irradiated by the incident light at the pixel.

Additionally, in this first aspect, the light-blocking wall may be configured having the tapered shape at an elevation angle based on an inverse tangent function of a triangle containing a perpendicular line from an apex of the taper down to the semiconductor substrate, with ½ of the width of the light-blocking wall and the width of the light-receiving surface corresponding to a base side of the triangle.

Additionally, in this first aspect, the light-blocking wall may be configured having a triangular cross-section having the tapered shape.

Additionally, in this first aspect, each of the plurality of pixels may include a color filter that transmits incident light, of the incident light focused, that has a predetermined wavelength.

Additionally, in this first aspect, the light-blocking wall may be configured in a shape that surrounds the color filter.

Additionally, in this first aspect, the light-blocking wall may block light by reflecting the incident light.

Additionally, in this first aspect, the light-blocking wall may be formed of a metal.

Additionally, in this first aspect, the light-blocking wall may be formed by transferring the shape of a mask, which is disposed on a top surface and has a tapered-shape cross-section, by etching the mask.

Additionally, in this first aspect, in the light-blocking wall, the mask may be disposed on the top surface having been formed in the tapered-shape cross-section by being etched back through plasma etching.

Additionally, a second aspect of the present disclosure is an imaging device, including: a plurality of pixels, each including a photoelectric conversion unit disposed on a semiconductor substrate and photoelectrically converting incident light that is irradiated, and an on-chip lens that focuses the incident light onto the photoelectric conversion unit; a light-blocking wall disposed adjacent to the semiconductor substrate at a boundary between the plurality of pixels and configured such that a side of the light-blocking wall that is irradiated with the incident light has a tapered-shape cross-section, the light-blocking wall blocking the incident light; and a processing circuit that processes an image signal generated on the basis of the photoelectric conversion.

The aspects of the present disclosure provide an effect that incident light entering near the boundary between pixels is incident on the tapered-shape part of the light-blocking wall. It is assumed that incident light entering near the boundary between pixels will be reflected at the tapered-shape part of the light-blocking wall.

DESCRIPTION OF EMBODIMENTS

Figure 1:
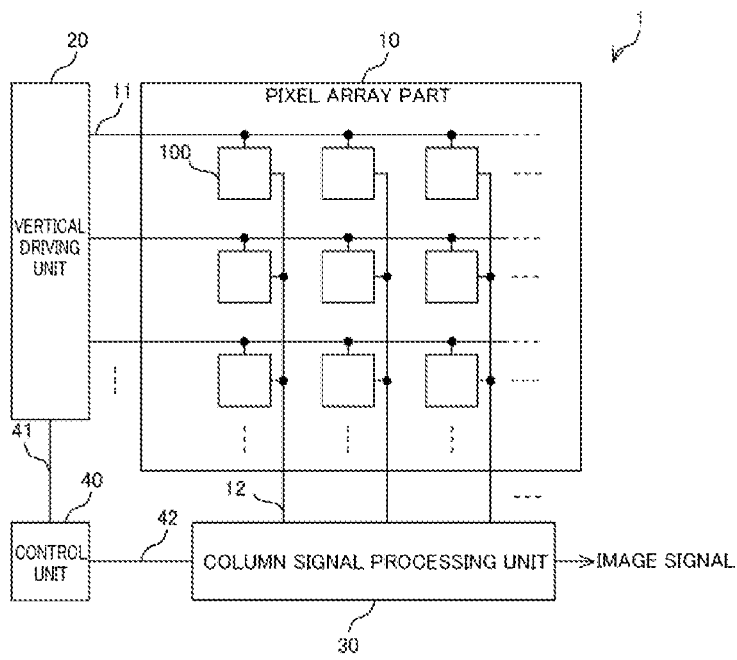
FIG. 1 is a diagram illustrating an example of the configuration of an image sensor according to an embodiment of the present disclosure.

Next, embodiments for implementing the present disclosure (hereinafter, referred to as embodiments) will be described with reference to the drawings. In the following drawings, the same or similar parts are denoted by the same or similar reference numerals and signs. In addition, the embodiments will be described in the following order.

1. First Embodiment
2. Second Embodiment
3. Third Embodiment
4. Fourth Embodiment
5. Example of Application to Camera

1. First Embodiment

[Configuration of Image Sensor]

FIG. 1 is a diagram illustrating an example of the configuration of an image sensor according to an embodiment of the present disclosure. In the figure, an image sensor 1 includes a pixel array part 10, a vertical driving unit 20, a column signal processing unit 30, and a control unit 40.

The pixel array part 10 is configured with pixels 100 disposed in a two-dimensional lattice form. Here, the pixels 100 generate image signals in response to radiated light. Each pixel 100 has a photoelectric conversion unit that generates a charge in response to the radiated light. In addition, each pixel 100 further has a pixel circuit. The pixel circuit generates an image signal based on charges generated by the photoelectric conversion unit. The generation of the image signal is controlled by a control signal generated by the vertical driving unit 20, which will be described later. Signal lines 11 and 12 are disposed in an XY matrix form in the pixel array part 10. The signal line 11 is a signal line through which a control signal of the pixel circuit in the pixel 100 is transmitted, is disposed for each row of the pixel array part 10, and wired in common for the pixels 100 disposed in each row. The signal line 12 is a signal line through which the image signal generated by the pixel circuit of the pixel 100 is transmitted, is disposed for each column of the pixel array part 10, and is wired in common for the pixels 100 disposed in each column. The photoelectric conversion unit and the pixel circuit are formed on a semiconductor substrate.

The vertical driving unit 20 generates the control signal of the pixel circuits of the pixels 100. The vertical driving unit 20 transmits the generated control signal to the pixels 100 through the signal lines 11 in the figure. The column signal processing unit 30 processes the image signals generated by the pixels 100. The column signal processing unit 30 processes the image signals transmitted from the pixels 100 through the signal lines 12 in the figure. The processing by the column signal processing unit 30 corresponds to, for example, analog-to-digital conversion of converting an analog image signal generated in the pixels 100 into a digital image signal. The image signal processed by the column signal processing unit 30 is output as an image signal of the image sensor 1. The control unit 40 controls the image sensor 1 as a whole. The control unit 40 generates and outputs control signals for controlling the vertical driving unit 20 and the column signal processing unit 30 to control the image sensor 1. The control signals generated by the control unit 40 are transmitted to the vertical driving unit 20 and the column signal processing unit 30 through signal lines 41 and 42. Meanwhile, the column signal processing unit 30 is an example of a processing circuit described in the claims

[Pixel Configuration]

Figure 2:
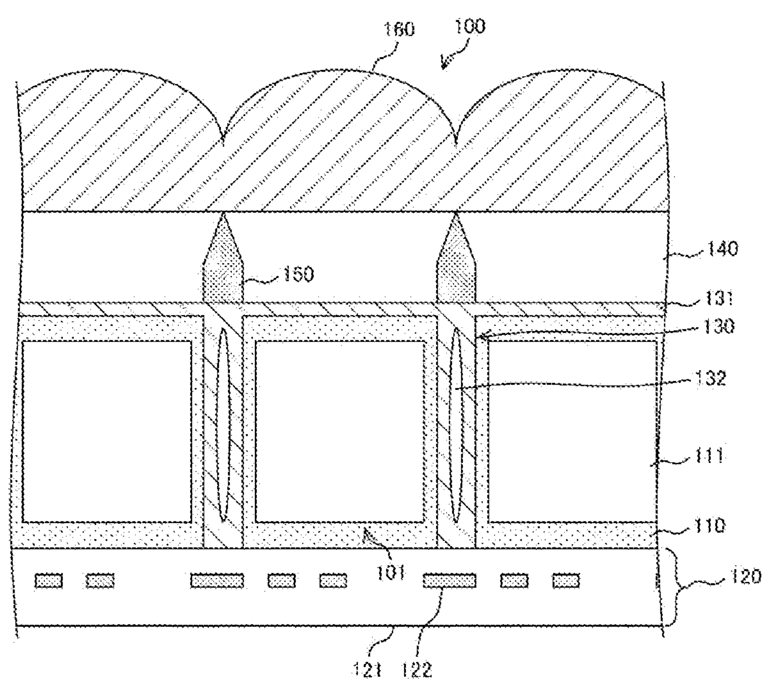
FIG. 2 is a diagram illustrating an example of the configuration of a pixel according to a first embodiment of the present disclosure.

FIG. 2 is a diagram illustrating an example of the configuration of the pixel according to the first embodiment of the present disclosure. The figure is a cross-sectional view illustrating an example of the configuration of the pixel 100 of the image sensor 1. In the figure, the pixel 100 includes a semiconductor substrate 110, a wiring region 120, a separation part 130, an insulating film 131, a color filter 140, a light-blocking wall 150, and an on-chip lens 160.

The semiconductor substrate 110 is a semiconductor substrate on which diffusion regions of elements such as the photoelectric conversion units, pixel circuits, and the like of the pixels 100 are disposed. The elements such as the photoelectric conversion units are disposed in a well region formed in the semiconductor substrate 110. For convenience, it is assumed that the semiconductor substrate 110 in the figure is formed in a p type well region. The diffusion regions of the elements can be provided by forming an n type semiconductor region in the p type well region. A photoelectric conversion unit 101 is illustrated in the figure as an example. The photoelectric conversion unit 101 is constituted by an n type semiconductor region 111. Specifically, a photodiode configured using a pn junction between the n type semiconductor region 111 and a p type well region in the periphery thereof corresponds to the photoelectric conversion unit 101.

The wiring region 120 is a region where wiring, which is disposed on a front surface side of the semiconductor substrate 110 and which transmits signals to the elements formed on the semiconductor substrate 110, is formed. The wiring region 120 in the figure includes a wiring layer 122 and an insulating layer 121. The wiring layer 122 is wiring that transmits signals to the elements and the like. The wiring layer 122 can be formed of a metal such as copper (Cu), tungsten (W), or the like. The insulating layer 121 insulates the wiring layer 122. The insulating layer 121 can be formed of an insulator such as silicon oxide ($SiO_2$), silicon nitride (SiN), or the like.

The separation part 130 is disposed on the semiconductor substrate 110 at the boundaries between the pixels 100 and separates the pixels 100 from each other. The separation part 130 in the figure is formed in a shape that surrounds the semiconductor substrate 110 of the pixels 100, and electrically separates the pixels 100 from each other. This makes it possible to prevent charges from neighboring pixels 100 from flowing in, and reduce the occurrence of noise. The separation part 130 in the figure can be formed by disposing an insulator such as $SiO_2$, SiN, or the like in a trench formed in the semiconductor substrate 110.

The insulating film 131 is a film that insulates the rear surface side of the semiconductor substrate 110. This insulating film 131 can be formed of an insulator such as $SiO_2$, SiN, or the like. The insulating film 131 also protects the rear surface side of the semiconductor substrate 110. Note that the insulating film 131 can be formed at the same time as the separation part 130. Specifically, the aforementioned trench is formed in the semiconductor substrate 110, and a film of $SiO_2$ or the like is disposed on the rear surface of the semiconductor substrate 110, including the inside of the trench. The insulating film 131 and the separation part 130 can therefore be formed. When forming the separation part 130, a cavity 132 may be formed in a central part of the separation part 130.

The color filter 140 is an optical filter through which incident light having a predetermined wavelength among incident light is transmitted. A color filter that transmits red light, green light, and blue light, for example, can be used as the color filter 140. A color filter 140 corresponding to any of these three wavelengths can be disposed in the pixel 100.

The on-chip lens 160 is a lens that focuses incident light. The on-chip lens 160 is formed in a hemispherical shape, and focuses incident light on the photoelectric conversion unit 101. The on-chip lens 160 can be formed of an inorganic material such as SiN, an organic material such as acrylic resin, or the like. Note that a region of a lower layer of the hemispherical lens part constituting the on-chip lens 160 constitutes a protective film that protects the rear surface of the pixel 100. The protective film further planarizes the surface on which the on-chip lens 160 is formed.

The light-blocking wall 150 blocks incident light. The light-blocking wall 150 is disposed adjacent to the semiconductor substrate 110 at the boundary between the pixels 100, and blocks the incident light entering through the adjacent pixels 100 at an angle. This makes it possible to prevent crosstalk. Here, "crosstalk" is a phenomenon in which noise is introduced into the image signal due to the influence of incident light transmitted through the on-chip lens 160 of the pixel 100 itself, the on-chip lens 160 aside from the color filter 140, and the like. The light-blocking wall 150 is configured in a shape that surrounds the pixel 100 and blocks incident light from adjacent pixels 100. In the figure, the light-blocking wall 150 is disposed adjacent to the semiconductor substrate 110 over the insulating film 131. Additionally, in the figure, the light-blocking wall 150 is disposed in the same layer as the color filter 140, and is configured in a shape that surrounds the color filter 140.

The light-blocking wall 150 can block light by reflecting incident light from adjacent pixels 100. This light-blocking wall 150 can be formed of a metal such as W, titanium (Ti), or the like. In this case, it is suitable to configure the light-blocking wall 150 of a material that has a high reflection coefficient and a low absorption coefficient for the incident light. This is because the incident light reflected by the light-blocking wall 150 can be increased, and the sensitivity can be improved when the reflected light is guided to the photoelectric conversion units.

The light-blocking wall 150 can be configured to have a height that is approximately the same as the thickness of the color filter 140. It is also possible to configure the light-blocking wall 150 to have a height that is approximately the same as the thickness of the protective film in the layer below the color filter 140 and the on-chip lens 160. It is also suitable to configure the light-blocking wall 150 to be at least 50 nm wide, for example. This is because when the light-blocking wall 150 is narrow, incident light that passes through the light-blocking wall 150 and enters the adjacent pixels 100 increases.

The light-blocking wall 150 can be configured having a tapered cross-section at an upper part thereof. In other words, the cross-section of the light-blocking wall 150 is configured having a tapered shape on the side where the incident light is irradiated. Incident light entering the vicinity of the boundaries between the pixels 100 is reflected by the sloped face of this tapered shape, and enters the photoelectric conversion unit 101 of the semiconductor substrate 110. This makes it possible to further improve the sensitivity. Additionally, because the reflected light from the light-blocking wall 150 is not directed to the outside of the pixel 100, the occurrence of flare can be prevented.

[Configuration of Light-Blocking Wall]

Figure 3A:
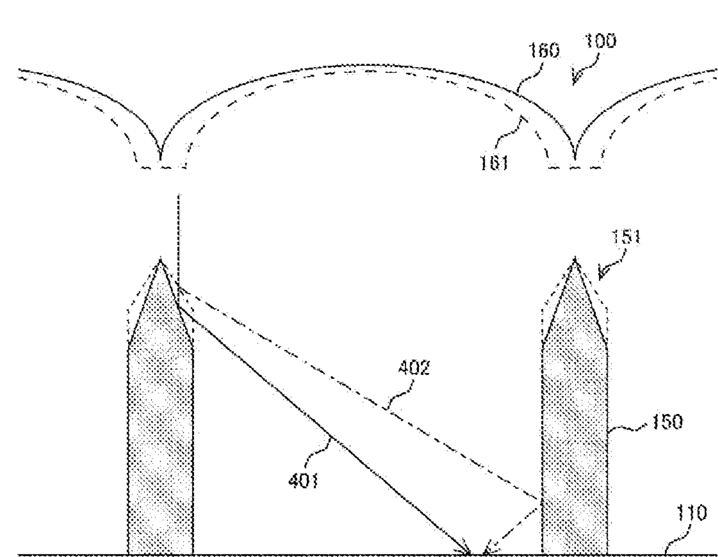
FIGS. 3A and 3B are diagrams illustrating an example of light being blocked according to the first embodiment of the present disclosure.
Figure 3B:
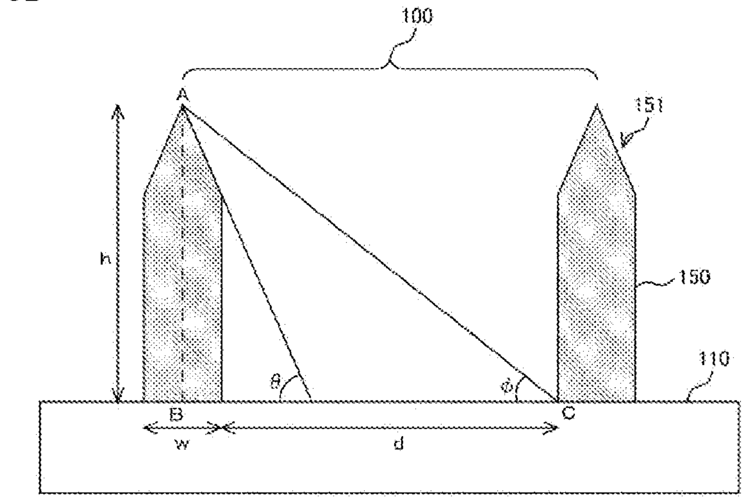

FIGS. 3A and 3B are diagrams illustrating an example of light being blocked according to the first embodiment of the present disclosure. This figure is a figure illustrating an example of the blocking of incident light by the light-blocking wall 150, and is a simplified cross-sectional view of the pixel 100. The insulating film 131 adjacent to the semiconductor substrate 110 is not shown in this figure.

FIG. 3A is a figure illustrating the reflection of incident light by the light-blocking wall 150. The incident light on the pixel 100 is focused on the semiconductor substrate 110 in a central part of the pixel 100 by the on-chip lens 160. On the other hand, if the incident light enters the valley between the on-chip lenses 160 at the boundary of the pixel 100, some of the incident light will not be focused and will instead proceed straight and reach the light-blocking wall 150. If the upper part of the light-blocking wall 150 is flat, incident light is reflected in a direction away from the pixel 100, resulting in reduced sensitivity. Accordingly, by configuring the upper part of the light-blocking wall 150 in a tapered shape, incident light entering near the boundary between the pixels 100 can be reflected in the direction of the semiconductor substrate 110. Specifically, a tapered sloped face 151 of the light-blocking wall 150 reflects incident light entering near the boundary between the pixels 100 in the direction of the semiconductor substrate 110. This enables the incident light that enters near the boundary between the pixels 100 and reaches the light-blocking wall 150 to contribute to the photoelectric conversion.

The dotted line in FIG. 3A represents an example of an on-chip lens 161 having a flat surface between that on-chip lens and the adjacent on-chip lens. The effect is more pronounced for the on-chip lens 161 having such a shape. This is because there is a large amount of incident light from the flat surface between the adjacent on-chip lenses, and a high sensitivity can be obtained by reflecting the incident light from this flat part to the photoelectric conversion unit 101 of the semiconductor substrate 110.

The arrows in FIG. 3A represents the incident light reflected by the light-blocking wall 150. Of these, the solid line arrow represents incident light 401 that is reflected by the tapered sloped face 151 of the light-blocking wall 150 and reaches the semiconductor substrate 110. In this manner, when the angle formed between the tapered sloped faces 151 that face each other is relatively small, the reflected light is directly incident on the semiconductor substrate 110. In this case, the incident light excluding the incident light attenuated by the light-blocking wall 150 can be caused to be incident on the semiconductor substrate 110. The incident light attenuated by the light-blocking wall 150 is incident light transmitted through the light-blocking wall 150 and incident light absorbed by the light-blocking wall 150.

On the other hand, when the angle formed between the tapered sloped faces 151 that face each other is relatively large, as with the light-blocking wall 150 indicated by the broken line, the reflected light reaches the light-blocking wall 150 at the boundary on the opposite side of the pixel 100. The dot-dash line arrow in FIG. 3A represents incident light 402 when the angle formed between the tapered sloped faces 151 that face each other is relatively large. The incident light 402 is reflected by the sloped face 151 of the light-blocking wall 150, is then reflected by the side surface of the other light-blocking wall 150, and is then incident on the semiconductor substrate 110. In this case, the incident light is attenuated by the light-blocking wall 150 twice, which reduces the incident light on the semiconductor substrate 110. The sensitivity is therefore not sufficiently improved. To sufficiently improve the sensitivity, it is necessary to ensure that the incident light reaches the semiconductor substrate 110 having been reflected once by the sloped face 151 of the light-blocking wall 150.

FIG. 3B is a drawing illustrating an example of the angle of the tapered shape of the light-blocking wall 150. In FIG. 3B, h and w represent the height and the cross-sectional width, respectively, of the light-blocking wall 150. d represents the width of the semiconductor substrate 110 part of a light-receiving surface of the pixel 100. This d corresponds to the width of an opening part of the light-blocking wall 150 in the light-receiving surface. The angle of the tapered shape of the light-blocking wall 150 can be expressed by an elevation angle θ of the sloped face 151 from the surface of the semiconductor substrate 110. To ensure that incident light is reflected by the sloped face 151 of the light-blocking wall 150 and is directly incident on the semiconductor substrate 110, it is necessary to configure the sloped face 151 having an angle of slope greater than the angle at which the incident light reflected at the apex of the light-blocking wall 150 reaches the bottom end of the light-blocking wall 150.

In FIG. 3B, an angle q of a point C of a triangle consisting of a vertex A of the light-blocking wall 150, a point B from this vertex A down to the surface of the semiconductor substrate 110, and the point C where the opposing light-blocking wall 150 and the semiconductor substrate 110 meet, can be expressed as follows when the length of the base is represented by b.

$$\varphi=\arctan(h/b)$$

Here, $b=w/2+d$.

To obtain this angle φ, the elevation angle θ can be expressed as follows.

$$\theta=(90+\varphi)/2 \quad (1)$$

Setting the elevation angle of the tapered sloped face 151 of the light-blocking wall 150 to be greater than e makes it possible to reflect the incident light, which has been reflected at the sloped face 151, to the semiconductor substrate 110.

Although the insulating film 131 on the rear surface side of the semiconductor substrate 110 is not shown in the figure, the height h of the light-blocking wall 150 can be set to a value that includes the thickness of the insulating film 131.

This will be described using specific values. If the width (w) and height (h) of the light-blocking wall 150 are 120 nm and 300 nm, respectively, the width (d) of the light-receiving surface of the pixel 100 is 1,500 nm, and the thickness of the insulating film 131 is 100 nm, the elevation angle θ is approximately 52 degrees. Disposing the light-blocking wall 150, which has the sloped face 151 configured at an angle greater than the elevation angle θ, makes it possible to prevent the incident light from being reflected two or more times by the light-blocking wall 150.

In this manner, by configuring the upper part of the light-blocking wall 150 in a tapered shape having an angle based on the height of the light-blocking wall 150, the width of the light-blocking wall 150, and the width of the light-receiving surface, incident light incident near the boundary between the pixels 100 can be prevented from being reflected two or more times by the light-blocking wall 150. This makes it possible to improve the sensitivity of the pixel 100.

[Method for Manufacturing Image Sensor]

FIGS. 4A, 4B, 4C, 5A, 5B, and 5C are diagrams illustrating an example of a method for manufacturing the image sensor according to the first embodiment of the present disclosure. FIGS. 4A, 4B, 4C, 5A, 5B, and 5C illustrate examples of steps for manufacturing the light-blocking wall 150 of the image sensor 1. Note that a publicly-known manufacturing method can be employed for the parts of the image sensor 1 aside from the light-blocking wall 150.

Figures 4A, 4B, 4C:
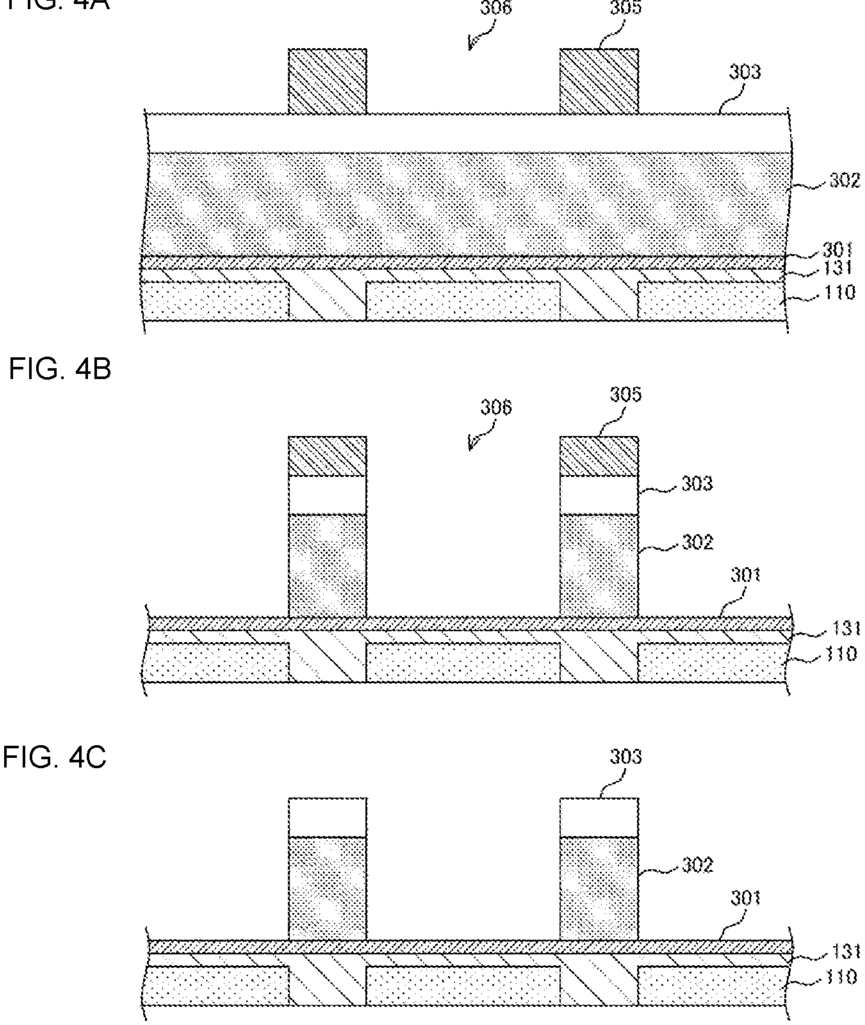
FIGS. 4A, 4B and 4C are diagrams illustrating an example of a method for manufacturing an image sensor according to the first embodiment of the present disclosure.
Figure 5A:
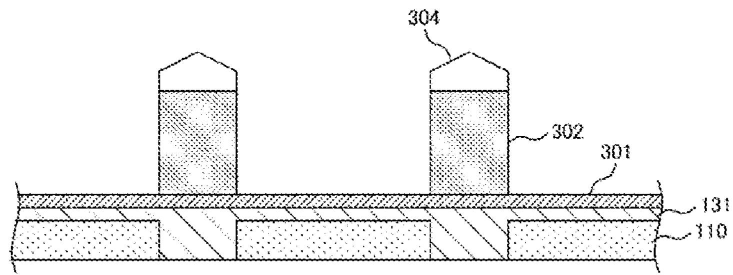
FIGS. 5A, 5B, and 5C are diagrams illustrating an example of a method for manufacturing an image sensor according to the first embodiment of the present disclosure.
Figure 5B:
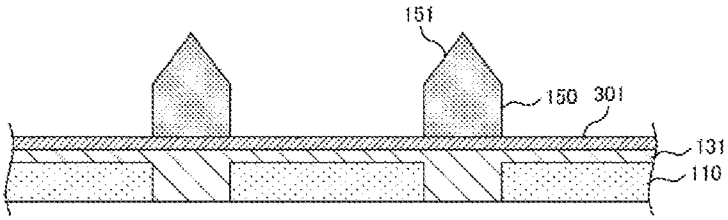
Figure 5C:
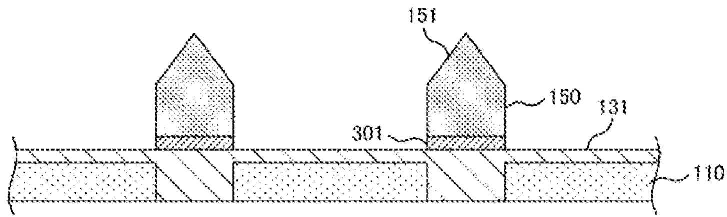

First, on the back side of the semiconductor substrate 110, in which the diffusion region is formed, the wiring region 120 is formed on the front surface, and the separation part 130 and the insulating film 131 are disposed on the rear surface, a Ti film 301, which serves as an etching stopper as described below, a material film 302 of the light-blocking wall 150, and a material film 303 of a hard mask are layered in order. A film of W can be used for the material film 302 of the light-blocking wall 150. A film of SiN can be used for the material film 303 of the hard mask. The deposition of these films can be done by, for example, Chemical Vapor Deposition (CVD). Next, a resist 305 having an opening part 306 is disposed in regions aside from the region where the light-blocking wall 150 is to be disposed (FIG. 4A).

Next, the material films 302 and 303 are etched, using the resist 305 as a mask. This can be performed through anisotropic etching using dry etching. For example, the etching is performed using sulfur hexafluoride (SF6) and methane trifluoride (CHF3) as etchant gases. At this time, the Ti film 301 is used as an etching stopper (FIG. 4B).

The resist 305 is then removed. This can be done, for example, through ashing using oxygen (O2) (FIG. 4C).

Next, the top surface of the material film 303 is etched into a tapered shape to form a hard mask 304. This can be performed by etching back using dry etching. For example, the etching is performed using argon (Ar) and carbon tetrafluoride (CF4) as etchant gases. The etching rate in this etching has angular dependence, and the edges (corners) of the material film 303 are etched faster than the central part of the cross-section. As a result, a hard mask 304 having a tapered upper part can be formed as shown in the figure (FIG. 5D). This step makes it possible to dispose the hard mask 304, which is formed having a tapered cross-section, on the top surface of the material film 302. Note that the hard mask 304 is an example of a "mask" described in the claims.

Next, the hard mask 304 and the material film 302 are etched. This can be performed through anisotropic etching using dry etching. For example, the etching is performed using SF6 and CHF3 as etchant gases. The shape of the hard mask 304 can be transferred to the material film 302 through this anisotropic etching. The light-blocking wall 150 having the sloped face 151 can be formed (FIG. 5E). The angle of the sloped faces 151 can be adjusted by adjusting the selection ratio of the hard mask 304 and the material film 302. For example, the sloped face 151 having a greater elevation angle than the hard mask 304 can be formed by using an etchant gas having a higher etching rate for the material film 302 than the hard mask 304.

Finally, the Ti film 301 is removed, aside from the part below the light-blocking wall 150. This can be done by etching the Ti film 301. Specifically, the etching is performed using chlorine (Cl2) as the etchant gas. This makes it possible to remove the Ti film 301 aside from the part below the light-blocking wall 150 (in-FIG. 5E). Through the process described above, the light-blocking wall 150 having the Ti film 301 (not shown in FIG. 2) in the lower layer can be manufactured.

Although the image sensor 1 described with reference to FIG. 2 is configured as a backside-illuminated image sensor in which incident light is irradiated on the back side of the semiconductor substrate 110, note that the image sensor 1 can also be configured as a frontside-illuminated image sensor in which incident light is irradiated on the front surface side of the semiconductor substrate 110.

As described thus far, the image sensor 1 of the first embodiment of the present disclosure includes, at the boundary between the pixels 100, the light-blocking wall 150 in which the side configured in a tapered shape on the side on which incident light is irradiated, and reflects incident light incident near the boundary between the pixels 100 toward the semiconductor substrate 110. By adjusting the angle of the sloped face 151 that constitutes the tapered shape of the light-blocking wall 150 to limit the number of times the incident light is reflected near the boundary between the pixels 100 to one time, the sensitivity of the pixel 100 can be improved.

2. Second Embodiment

The image sensor 1 of the first embodiment described above used a tapered light-blocking wall 150 having a sharp apex in the cross-section. As opposed to this, the image sensor 1 of the second embodiment of the present disclosure differs from the above-described first embodiment in that a light-blocking wall 150 having a different shape is used.

[Configuration of Light-Blocking Wall]

Figure 6A:
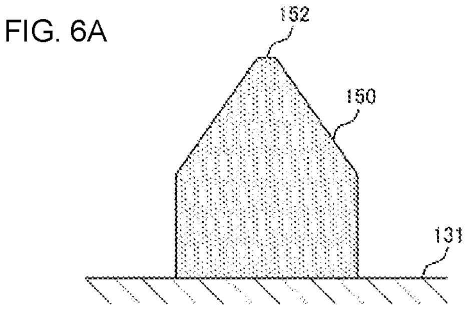
FIGS. 6A, 6B, and 6C are diagrams illustrating an example of the configuration of a light-blocking wall according to a second embodiment of the present disclosure.
Figure 6B:
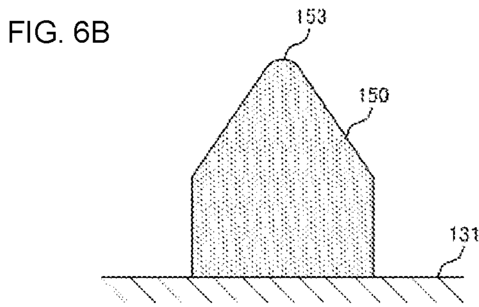
Figure 6C:
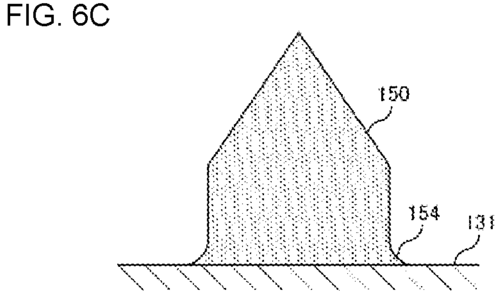

FIGS. 6A, 6B, and 6C are diagrams illustrating an example of the configuration of a light-blocking wall according to the second embodiment of the present disclosure. This figure is a cross-sectional view of an example of the configuration of the light-blocking wall 150.

FIG. 6A indicates the light-blocking wall 150, in which a tapered top part 152 configured on a flat surface is provided. Additionally, FIG. 6B indicates the light-blocking wall 150, in which a tapered top part 153 configured on a curved surface is provided. Depending on the method of manufacturing the light-blocking wall 150, it may not be possible to form the wall having a pointed top part, as illustrated in FIG. 2. Even in such a case, by forming the sloped face 151 in the upper part of the light-blocking wall 150, incident light entering near the boundary between the pixels 100 can be reflected onto the semiconductor substrate 110. For example, configuring the region of the top parts 152 and 153 at a size 10% the width of the light-blocking wall 150, most of the incident light near the boundary between the pixels 100 can be reflected onto the semiconductor substrate 110. Additionally, configuring the region of the top parts 152 and 153 at a size 5% the width of the light-blocking wall 150 makes it possible to reflect even more of the incident light onto the semiconductor substrate 110, which makes it possible to improve the sensitivity.

FIG. 6C represents the light-blocking wall 150 having a bottom part 154 in which the cross-section has a curved shape. In the light-blocking wall 150 having such a shape, it is necessary to configure the sloped face 151 at the angle at which the incident light is incident on the edge of the bottom part 154. Specifically, the width d of the light-receiving surface of the pixel 100 is modified to the width from the edge of the bottom part 154, as illustrated in FIG. 3B.

[Other Configuration of Light-Blocking Wall]

Figure 7A:
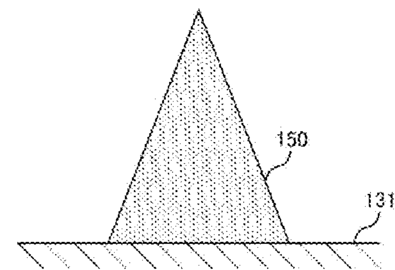
FIGS. 7A, 7B, and 7C are diagrams illustrating another example of the configuration of a light-blocking wall according to a second embodiment of the present disclosure.
Figure 7B:
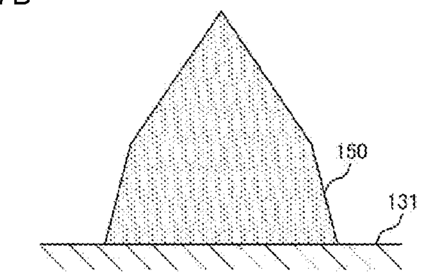
Figure 7C:
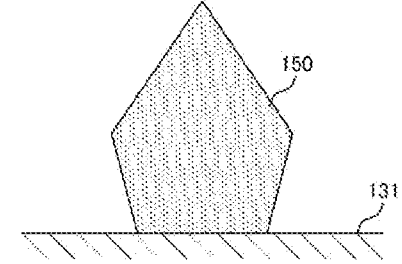

FIGS. 7A, 7B, and 7C are diagrams illustrating another example of the configuration of the light-blocking wall according to the second embodiment of the present disclosure. This figure is a cross-sectional view of an example of the configuration of the light-blocking wall 150.

FIG. 7A represents the light-blocking wall 150 configured having a triangular cross-section. This light-blocking wall 150 is constituted by a sloped faces 151 extending to the front surface of the insulating film 131. A light-blocking wall 150 having such a shape can be used when the height of the light-blocking wall 150 is relatively low. As mentioned above, it is suitable to configure the light-blocking wall 150 to have a width of 50 nm or more. This is to reduce the transmission of incident light near the top part of the light-blocking wall 150.

FIG. 7B represents a light-blocking wall 150 having a widened bottom part. Additionally, FIG. 7C represents a light-blocking wall 150 having a narrowed bottom part. With either of these light-blocking walls 150, the sensitivity of the pixel 100 can be improved by configuring the shape to have a sloped face 151 at an angle based on the height and width of the light-blocking wall 150 and the width of the light-receiving surface of the pixel 100.

The configuration of the image sensor 1 aside from the aforementioned configuration is the same as the configuration of the image sensor 1 described in the first embodiment of the present disclosure, and will therefore not be described.

As described thus far, the image sensor 1 of the second embodiment of the present disclosure is capable of reflecting incident light onto the semiconductor substrate 110 even when a light-blocking wall 150 having different shapes and the like for the top part is used.

3. Third Embodiment

In the image sensor 1 of the first embodiment described above, the color filter 140 is provided in the pixel 100. However, an image sensor 1 of a third embodiment of the present disclosure differs from the above-described first embodiment in that the color filter 140 of the pixel 100 is omitted.

[Pixel Configuration]

Figure 8:
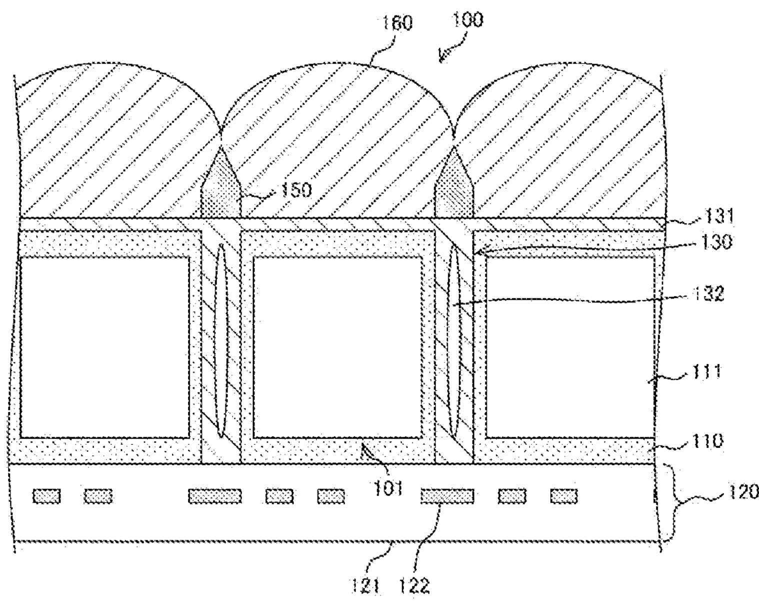
FIG. 8 is a diagram illustrating an example of the configuration of a pixel according to a third embodiment of the present disclosure.

FIG. 8 is a diagram illustrating an example of the configuration of a pixel according to the third embodiment of the present disclosure. Like FIG. 2, this figure is a diagram illustrating an example of the configuration of the pixel 100. This configuration differs from the pixel 100 in FIG. 2 in that the color filter 140 is omitted.

The pixel 100 in the figure generates a monochrome image signal. The color filter 140 is omitted for this reason. In the on-chip lens 160 in the figure, a protective film part of the lower layer is disposed adjacent to the insulating film 131. The light-blocking wall 150 in the figure is disposed in the protective film part of the lower layer of this on-chip lens 160, and is configured in a shape that surrounds this protective film part. This light-blocking wall 150 makes it possible to reflect incident light entering near the boundary between the pixels 100 onto the semiconductor substrate 110.

The configuration of the image sensor 1 aside from the aforementioned configuration is the same as the configuration of the image sensor 1 described in the first embodiment of the present disclosure, and will therefore not be described.

As described above, the image sensor 1 of the third embodiment of the present disclosure makes it possible to improve the sensitivity of the pixel 100 that does not have the color filter 140 and generates monochrome image signals.

4. Fourth Embodiment

In the image sensor 1 of the first embodiment described above, the light-blocking wall 150 is disposed near the edge of the on-chip lens 160 at the boundary between the pixels 100. However, an image sensor 1 of a fourth embodiment of the present disclosure differs from the above-described first embodiment in that the on-chip lens 160 is disposed in a shifted position.

[Pixel Configuration]

Figure 9:
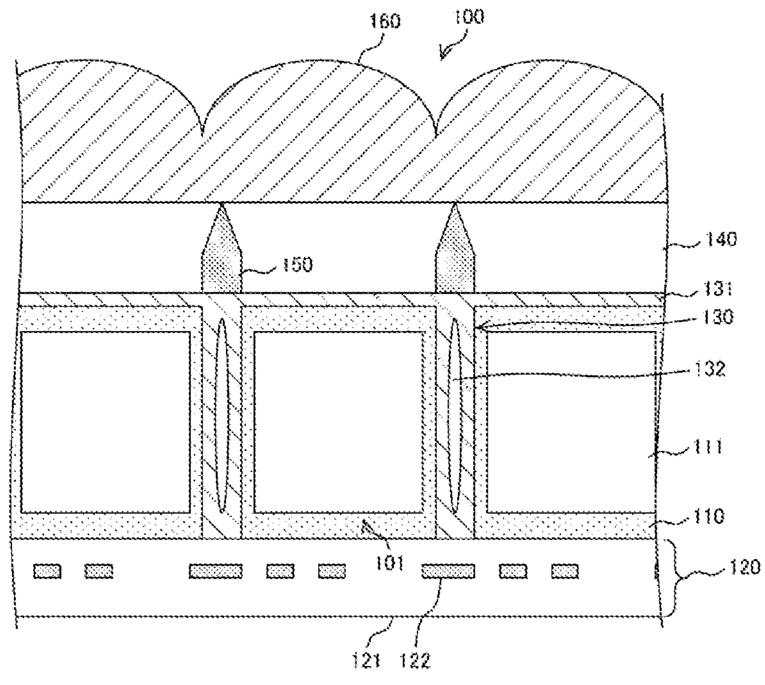
FIG. 9 is a diagram illustrating an example of the configuration of a pixel according to a fourth embodiment of the present disclosure.

FIG. 9 is a diagram illustrating an example of the configuration of a pixel according to the fourth embodiment of the present disclosure. Like FIG. 2, this figure is a diagram illustrating an example of the configuration of the pixel 100. The configuration differs from the pixel 100 in FIG. 2 in that the on-chip lens 160 is disposed in a position sifted from the center of the pixel 100.

The pixel 100 in the figure represents the pixel 100 provided at a peripheral part of the pixel array part 10 illustrated in FIG. 1. Incident light enters the pixel 100, which is located in a central part of the pixel array part 10, in a substantially vertical direction. In contrast, the pixels 100 provided at peripheral parts of the pixel array part 10 receive incident light at an angle. Accordingly, as illustrated in the figure, by disposing the on-chip lens 160 shifted from the center of the pixel 100, it is possible to focus the incident light incident at an angle onto the photoelectric conversion unit 101 of that pixel 100 itself. This correction of the position of the on-chip lens 160 and the like is called "pupil correction".

The light-blocking wall 150 illustrated in the figure can be disposed near the edge of the on-chip lens 160. Specifically, the light-blocking wall 150 can be disposed at a position where the sloped face 151 is near the edge of the on-chip lens 160. This makes it possible for incident light entering near the edge of the on-chip lens 160 to be reflected onto the semiconductor substrate 110.

The configuration of the image sensor 1 aside from the aforementioned configuration is the same as the configuration of the image sensor 1 described in the first embodiment of the present disclosure, and will therefore not be described.

As described above, the image sensor 1 of the fourth embodiment of the present disclosure makes it possible to improve the sensitivity of the pixel 100 that performs pupil correction.

5. Example of Application to Camera

The technique according to the present disclosure (the present technique) can be applied to various products. For example, the present technique may be realized as an image sensor mounted in an imaging device such as a camera.

Figure 10:
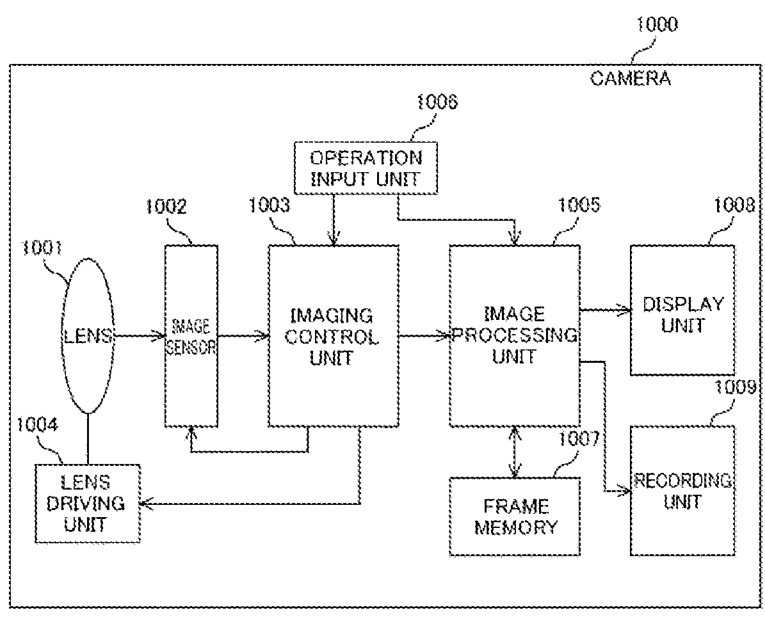
FIG. 10 is a block diagram schematically illustrating an example of the configuration of a camera serving as an example of an imaging device to which the present technique can be applied.

FIG. 10 is a block diagram schematically illustrating an example of a camera that is an example of an imaging device to which the present technique can be applied. A camera 1000 in the figure includes a lens 1001, an image sensor 1002, an imaging control unit 1003, a lens driving unit 1004, an image processing unit 1005, an operation input unit 1006, a frame memory 1007, a display unit 1008, and a recording unit 1009.

The lens 1001 is an imaging lens of the camera 1000. The lens 1001 focuses light from a subject, causing the light to be incident on the image sensor 1002, which will be described later, and forms an image of the subject.

The image sensor 1002 is a semiconductor device that images the light from the subject focused by the lens 1001. The image sensor 1002 generates an analog image signal according to radiated light, converts the analog image signal into a digital image signal, and outputs the digital image signal.

The imaging control unit 1003 controls the imaging by the image sensor 1002. The imaging control unit 1003 controls the image sensor 1002 by generating a control signal and outputting the control signal to the image sensor 1002. In addition, the imaging control unit 1003 can perform autofocus in the camera 1000 on the basis of an image signal output from the image sensor 1002. Here, "autofocus" is a system that detects a focal position of the lens 1001 and automatically adjusts the focal position. As the autofocus, a method of detecting an image surface phase difference according to phase difference pixels disposed in the image sensor 1002 to detect a focal position (image surface phase difference autofocus) can be used. In addition, a method of detecting a position at which the contrast of an image is maximum as the focal position (contrast autofocus) can also be applied. The imaging control unit 1003 performs autofocus by adjusting the position of the lens 1001 through the lens driving unit 1004 on the basis of the detected focal position. Note that the imaging control unit 1003 can be configured as, for example, a digital signal processor (DSP) provided with firmware.

The lens driving unit 1004 drives the lens 1001 on the basis of control by the imaging control unit 1003. The lens driving unit 1004 can drive the lens 1001 by changing the position of the lens 1001 using a motor provided therein.

The image processing unit 1005 processes an image signal generated by the image sensor 1002. This processing corresponds to, for example, demosaicing for generating an image signal of an omitted color among image signals corresponding to red, green, and blue for each pixel, noise reduction for removing noise in an image signal, image signal encoding, and the like. The image processing unit 1005 can be configured as, for example, a microcomputer provided with firmware.

The operation input unit 1006 receives an operation input from a user of the camera 1000. For example, a pushbutton or a touch panel can be used as the operation input unit 1006. An operation input received by the operation input unit 1006 is transmitted to the imaging control unit 1003 and the image processing unit 1005. Thereafter, processing in response to the operation input, for example, processing of imaging a subject, and the like is started.

The frame memory 1007 is memory storing a frame that is an image signal corresponding to one screen. The frame memory 1007 is controlled by the image processing unit 1005 and holds frames during image processing.

The display unit 1008 displays an image processed by the image processing unit 1005. For example, a liquid crystal panel can be used as the display unit 1008.

The recording unit 1009 records an image processed by the image processing unit 1005. For example, a memory card or a hard disk can be used as the recording unit 1009.

A camera to which the present disclosure can be applied has been described above. The present technique can be applied to the image sensor 1002 among the components described above. Specifically, the image sensor 1 illustrated in FIG. 1 can be applied to the image sensor 1002. By applying the image sensor 1 to the image sensor 1002, the sensitivity can be improved. Clear images can be obtained even in low-light environments. Meanwhile, the image processing unit 1005 is an example of a processing circuit described in the claims. The camera 1000 is an example of an imaging device described in the claims.

The configuration of the pixel 100 of the second embodiment can be combined with other configurations. Specifically, the shapes of the light-blocking wall 150 in FIGS. 6A, 6B, 60, 7A, 7B, and 7C can be applied to the light-blocking wall 150 in FIGS. 8 and 9.

Additionally, the configuration of the pixel 100 of the third embodiment can be combined with other configurations. Specifically, the color filter 140 can be omitted from the pixel 100 in FIG. 9.

Additionally, the configuration of the pixel 100 of the fourth embodiment can be combined with other configurations. Specifically, pupil correction can be performed in the pixel 100 in FIG. 8.

Finally, the descriptions of each of the above-described embodiments are merely examples of the present disclosure, and the present disclosure is not limited to the above-described embodiments. Therefore, it goes without saying that various changes aside from the above-described embodiments can be made according to the design and the like within a scope that does not depart from the technical spirit of the present disclosure.

Additionally, the effects described in the present specification are merely examples, and are not limiting. Other effects may be obtained as well.

In addition, the drawings in the above-described embodiments are schematic, and dimensional ratios and the like of respective parts are not necessarily consistent with actual ones. In addition, the drawings of course include parts where dimensional relationships and ratios differ from drawing to drawing.

The present technique can also have the following configurations.

(1) An image sensor including: a plurality of pixels, each including a photoelectric conversion unit disposed on a semiconductor substrate and photoelectrically converting incident light that is irradiated, and an on-chip lens that focuses the incident light onto the photoelectric conversion unit; and a light-blocking wall disposed adjacent to the semiconductor substrate at a boundary between the plurality of pixels and configured such that a side of the light-blocking wall that is irradiated with the incident light has a tapered-shape cross-section, the light-blocking wall blocking the incident light.

(2) The image sensor according to (1), wherein the light-blocking wall is configured having the tapered cross-section tapered at an angle based on a height and a width of the light-blocking wall from the semiconductor substrate and a width of a light-receiving surface, the light-receiving surface being a surface of the semiconductor substrate irradiated by the incident light at the pixel.

(3) The image sensor according to (2), wherein the light-blocking wall is configured having the tapered shape at an elevation angle based on an inverse tangent function of a triangle containing a perpendicular line from an apex of the taper down to the semiconductor substrate, with ½ of the width of the light-blocking wall and the width of the light-receiving surface corresponding to a base side of the triangle.

(4) The image sensor according to any one of (1) to (3), wherein the light-blocking wall is configured having a triangular cross-section having the tapered shape.

(5) The image sensor according to any one of (1) to (4), wherein each of the plurality of pixels includes a color filter that transmits incident light, of the incident light focused, that has a predetermined wavelength.

(6) The image sensor according to (5), wherein the light-blocking wall is configured in a shape that surrounds the color filter.

(7) The image sensor according to any one of (1) to (6), wherein the light-blocking wall blocks light by reflecting the incident light.

(8) The image sensor according to (7), wherein the light-blocking wall is formed of a metal.

(9) The image sensor according to any one of (1) to (8), wherein the light-blocking wall is formed by transferring the shape of a mask, which is disposed on a top surface and has a tapered-shape cross-section, by etching the mask.

(10) The image sensor according to (9), wherein in the light-blocking wall, the mask is disposed on the top surface having been formed in the tapered-shape cross-section by being etched back through plasma etching.

(11) An imaging device, comprising: a plurality of pixels, each including a photoelectric conversion unit disposed on a semiconductor substrate and photoelectrically converting incident light that is irradiated, and an on-chip lens that focuses the incident light onto the photoelectric conversion unit; a light-blocking wall disposed adjacent to the semiconductor substrate at a boundary between the plurality of pixels and configured such that a side of the light-blocking wall that is irradiated with the incident light has a tapered-shape cross-section, the light-blocking wall blocking the incident light; and a processing circuit that processes an image signal generated on the basis of the photoelectric conversion.

REFERENCE SIGNS LIST

1 Image sensor
10 Pixel array part
30 Column signal processing unit
100 Pixel
101 Photoelectric conversion unit
110 Semiconductor substrate
130 Separation part
131 Insulating film
140 Color filter
150 Light-blocking wall
151 Sloped face
152, 153 Top part
154 Bottom part
160, 161 On-chip lens
304 Hard mask
1000 Camera
1002 Image sensor
1005 Image processing unit

The invention claimed is:

1. An image sensor, comprising:
a semiconductor substrate;
a plurality of pixels, wherein each pixel of the plurality of pixels includes:
a photoelectric conversion unit on the semiconductor substrate, wherein the photoelectric conversion unit is configured to photoelectrically convert incident light; and
an on-chip lens configured to focus the incident light onto the photoelectric conversion unit;
a first light-blocking wall configured to block the incident light, wherein
the first light-blocking wall is adjacent to the semiconductor substrate at a first boundary between the plurality of pixels; and
a second light-blocking wall adjacent to the semiconductor substrate at a second boundary between the plurality of pixels, wherein
an elevation angle of a first tapered sloped face of the first light-blocking wall from a surface of the semiconductor substrate is greater than 0 in a cross-sectional view, $$\theta=(90+\varphi)/2,$$

$$\varphi=\arctan(h/b),$$

$$b=(w/2)+d,$$

in the cross-sectional view, the first tapered sloped face of the first light-blocking wall faces a second tapered sloped face of the first light-blocking wall,
a vertex of the first light-blocking wall is between the first tapered sloped face and the second tapered sloped face,
φ is a specific angle between the surface of the semiconductor substrate and a line connecting the vertex and a point where a wall surface of an opposing side of the second light-blocking wall opposing to the first light-blocking wall and the surface of the semiconductor substrate meet,
h represents a height of the first light-blocking wall,
w represents a width of the first light-blocking wall,
d represents a width of a light-receiving surface of a corresponding pixel of the plurality of pixels, and
the light-receiving surface of the corresponding pixel is the surface of the semiconductor substrate, irradiated by the incident light, between the first light-blocking wall and the second light-blocking wall.

2. The image sensor according to claim 1, wherein
a tapered-shape cross-section of the first light-blocking wall comprises the vertex, and
the tapered-shape cross-section corresponds to a triangular cross-section.

3. The image sensor according to claim 1, wherein each pixel of the plurality of pixels includes a color filter configured to transmit the incident light with a specific wavelength.

4. The image sensor according to claim 3, wherein the first light-blocking wall surrounds the color filter.

5. The image sensor according to claim 1, wherein the first light-blocking wall is further configured to:
reflect the incident light; and
block the incident light based on the reflection.

6. The image sensor according to claim 5, wherein the first light-blocking wall comprises a metal.

7. An imaging device, comprising:
a semiconductor substrate;
a plurality of pixels, wherein each pixel of the plurality of pixels includes:
a photoelectric conversion unit on the semiconductor substrate, wherein the photoelectric conversion unit is configured to photoelectrically convert incident light to an image signal; and
an on-chip lens configured to focus the incident light onto the photoelectric conversion unit;
a first light-blocking wall configured to block the incident light, wherein
the first light-blocking wall is adjacent to the semiconductor substrate at a first boundary between the plurality of pixels; and
a second light-blocking wall adjacent to the semiconductor substrate at a second boundary between the plurality of pixels, wherein
an elevation angle of a first tapered sloped face of the first light-blocking wall from a surface of the semiconductor substrate is greater than 0 in a cross-sectional view, $$\theta=(90+\varphi)/2,$$

$$\varphi=\arctan(h/b),$$

$$b=(w/2)+d,$$

in the cross-sectional view, the first tapered sloped face of the first light-blocking wall faces a second tapered sloped face of the first light-blocking wall,
a vertex of the first light-blocking wall is between the first tapered sloped face and the second tapered sloped face,
φ is a specific angle between the surface of the semiconductor substrate and a line connecting the vertex and a point where a wall surface of an opposing side of the second light-blocking wall opposing to the first light-blocking wall and the surface of the semiconductor substrate meet,
h represents a height of the first light-blocking wall,
w represents a width of the first light-blocking wall, d represents a width of a light-receiving surface of a corresponding pixel of the plurality of pixels, and the light-receiving surface of the corresponding pixel is the surface of the semiconductor substrate, irradiated by the incident light, between the first light-blocking wall and the second light-blocking wall; and a processing circuit configured to process the image signal.

* * * * *